(12) United States Patent
Zhou et al.

(10) Patent No.: US 11,342,474 B2
(45) Date of Patent: May 24, 2022

(54) METHOD FOR PREPARING AVALANCHE PHOTODIODE

(71) Applicant: THE 13TH RESEARCH INSTITUTE OF CHINA ELECTRONICS TECHNOLOGY GROUP CORPORATION, Shijiazhuang (CN)

(72) Inventors: Xingye Zhou, Shijiazhuang (CN); Zhihong Feng, Shijiazhuang (CN); Yuanjie Lv, Shijiazhuang (CN); Xin Tan, Shijiazhuang (CN); Yuangang Wang, Shijiazhuang (CN); Xubo Song, Shijiazhuang (CN); Jia Li, Shijiazhuang (CN); Yulong Fang, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 41 days.

(21) Appl. No.: 17/030,470

(22) Filed: Sep. 24, 2020

(65) Prior Publication Data

US 2021/0036177 A1 Feb. 4, 2021

Related U.S. Application Data

(63) Continuation of application No. PCT/CN2018/110439, filed on Oct. 16, 2018.

(30) Foreign Application Priority Data

May 4, 2018 (CN) .................. 201810421573.X

(51) Int. Cl.
| | |
|---|---|
| *H01L 31/107* | (2006.01) |
| *H01L 31/0312* | (2006.01) |
| *H01L 31/18* | (2006.01) |

(52) U.S. Cl.
CPC ...... *H01L 31/1075* (2013.01); *H01L 31/0312* (2013.01); *H01L 31/18* (2013.01)

(58) Field of Classification Search
CPC . H01L 31/1075; H01L 31/0312; H01L 31/18; H01L 31/0224; H01L 31/022416; H01L 31/107
See application file for complete search history.

(56) References Cited

U.S. PATENT DOCUMENTS

| | | | |
|---|---|---|---|
| 6,774,448 B1 | 8/2004 | Lindemann et al. | |
| 2017/0244002 A1* | 8/2017 | Campbell | ........... H01L 31/1075 |

FOREIGN PATENT DOCUMENTS

| | | | |
|---|---|---|---|
| CN | 104882510 A | | 9/2015 |
| CN | 106653932 A | * | 5/2017 |

(Continued)

*Primary Examiner* — Sitaramarao S Yechuri
(74) *Attorney, Agent, or Firm* — Slater Matsil, LLP

(57) ABSTRACT

A method for preparing an avalanche photodiode includes preparing a mesa on a wafer, growing a sacrificial layer on an upper surface of the wafer and a side surface of the mesa, removing the sacrificial layer in an ohmic contact electrode region of the wafer, preparing an ohmic contact electrode in the ohmic contact electrode region of the wafer, removing the sacrificial layer in a non-mesa region of the wafer, growing a passivation layer on the upper surface of the wafer and the side surface of the mesa, removing the passivation layer on the upper surface of the mesa of the wafer and the passivation layer in the non-mesa region of the wafer corresponding to the ohmic contact electrode region, and removing the sacrificial layer on the upper surface of the mesa of the wafer.

9 Claims, 2 Drawing Sheets

(56) References Cited

FOREIGN PATENT DOCUMENTS

| CN | 107170847 | A | | 9/2017 |
|---|---|---|---|---|
| CN | 107768462 | A | | 3/2018 |
| CN | 108511573 | A | * | 9/2018 |
| CN | 108550652 | A | | 9/2018 |

* cited by examiner

METHOD FOR PREPARING AVALANCHE PHOTODIODE

CROSS-REFERENCE TO RELATED APPLICATIONS

This application is a continuation application of International Application No. PCT/CN2018/110439, filed on Oct. 16, 2018, which claims priority to Chinese Patent Application No. CN201810421573.X, filed on May 4, 2018. The disclosures of the aforementioned applications are hereby incorporated herein by reference in their entireties.

TECHNICAL FIELD

The disclosure relates to the field of semiconductors, and in particular to a method for preparing an avalanche photodiode.

BACKGROUND

An ultraviolet detector based on a wide-band gap semiconductor avalanche photodiode is advantageous for being high in gain and quantum efficiency, low in dark current, small in size, easy to integrate, etc., and is expected to have potential capacity for applications in ultraviolet communication, astronomy research, fire detection, monitoring of corona of high-voltage equipment, etc. To suppress a surface leakage current of a silicon carbide (SiC) based avalanche photodiode for ultraviolet detection, a device may typically be passivated by growing a silicon oxide layer on a surface of the device via high temperature thermal oxidation. Growth of the silicon oxide layer via high temperature thermal oxidation however tends to form a carbon cluster, leading to a sharp increase of a dark current near a breakdown voltage of an avalanche photodiode operating at a high temperature. Moreover, a passivation layer of full coverage may lead to reduced responsivity of an avalanche photodiode. In view of this, a common practice is to etch away the passivation layer in a photosensitive area of the device to form an optical window. However, etching of the passivation layer may damage the surface of the photosensitive area of the device and induce surface defects that may absorb ultraviolet photons, thereby reducing responsivity and quantum efficiency of the device.

SUMMARY OF THE INVENTION

These and other problems are generally solved or circumvented, and technical advantages are generally achieved, by embodiments of the present disclosure which provide a method for preparing an avalanche photodiode.

Technical Problem

Embodiments herein provide a method for preparing an avalanche photodiode, capable of avoiding damages to the surface of the photosensitive area of a device caused by etching of the passivation layer, avoiding formation of surface defects that absorb ultraviolet photons, thereby improving responsivity and quantum efficiency of the device

Technical Solution

According to embodiments herein, a method for preparing an avalanche photodiode comprises: preparing a mesa on a wafer; growing a sacrificial layer on an upper surface of the wafer and on a side surface of the mesa; removing the sacrificial layer on an ohmic contact electrode region of the wafer; preparing an ohmic contact electrode on the ohmic contact electrode region of the wafer from which the sacrificial layer on the ohmic contact electrode region has been removed; removing the sacrificial layer on the side surface of the mesa and on a non-mesa region of the wafer on which the ohmic contact electrode is prepared, the non-mesa region being a region of the wafer outside of the mesa; growing a passivation layer on the upper surface of the wafer and the side surface of the mesa from which the sacrificial layer in the non-mesa region and on the side surface of the mesa has been removed; removing the passivation layer on the upper surface of the mesa of the wafer on which the passivation layer is grown, and removing the passivation layer in the non-mesa region of the wafer corresponding to the ohmic contact electrode region; and removing the sacrificial layer on the upper surface of the mesa of the wafer.

In one embodiment, the wafer may comprise, from bottom to top, a substrate, a silicon carbide $P^+$ layer, a silicon carbide N layer, a silicon carbide $N^-$ layer, and a silicon carbide $N^+$ layer; or The wafer may comprise, from bottom to top, a substrate, a silicon carbide $P^+$ layer, a silicon carbide $N^-$ layer, and a silicon carbide $N^+$ layer; or The wafer may comprise, from bottom to top, a substrate, a silicon carbide $P^+$ layer, and a silicon carbide N layer.

In one embodiment, the step of preparing the mesa on the wafer may comprise: etching the non-mesa region of the wafer via photolithography and etching process, down to an upper surface of the silicon carbide $P^+$ layer.

In one embodiment, the substrate may be a silicon carbide substrate.

In one embodiment, the step of preparing the ohmic contact electrode on the ohmic contact electrode region of the wafer from which the sacrificial layer on the ohmic contact electrode region has been removed, comprises: vapor-depositing a metal layer on the ohmic contact electrode region of the wafer from which the sacrificial layer on the ohmic contact electrode region has been removed; and preparing the ohmic contact electrode by annealing the wafer on which the metal layer is vapor-deposited in a nitrogen atmosphere.

In one embodiment, the mesa may be tilted with a preset angle.

In one embodiment, the sacrificial layer may be one of, or a multiple combination of, a silicon oxide layer, an aluminum oxide layer, a chromium oxide layer, an yttrium oxide layer, or a silicon nitride layer.

In one embodiment, the passivation layer may be one of, or a multiple combination of, a silicon oxide layer, an aluminum oxide layer, a chromium oxide layer, an yttrium oxide layer, or a silicon nitride layer.

In one embodiment, a thickness of the sacrificial layer may be from 10 nm to 300 nm. A thickness of the passivation layer may be from 50 nm to 500 nm.

In one embodiment, a material of the ohmic contact electrode may be one of, or a multiple combination of, nickel, titanium, aluminum, and gold.

Advantageous Effects of the Disclosure

With embodiments herein, an avalanche photodiode with an optical window is prepared by: preparing a mesa on a wafer; growing a sacrificial layer on an upper surface of the wafer with the mesa prepared, and on a side surface of the mesa; removing the sacrificial layer on an ohmic contact electrode region of the wafer; preparing an ohmic contact electrode on the ohmic contact electrode region of the wafer from which the sacrificial layer on the ohmic contact electrode region has been removed; removing the sacrificial layer in a non-mesa region of the wafer on which the ohmic contact electrode is prepared and on the side surface of the mesa; growing a passivation layer on the upper surface of the wafer and the side surface of the mesa from which the sacrificial layer in the non-mesa region and on the side surface of the mesa has been removed; removing the passivation layer on the upper surface of the mesa of the wafer on which the passivation layer is grown, and removing the passivation layer in the non-mesa region of the wafer corresponding to the ohmic contact electrode region; and removing the sacrificial layer on the upper surface of the mesa of the wafer. With embodiments herein, in preparing the optical window, by growing a sacrificial layer on the upper surface of a wafer and removing the sacrificial layer in two steps, a photosensitive surface of a device is protected from damages, thereby decreasing a leakage current of the device, and improving responsivity and quantum efficiency of the device.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Drawings for describing embodiments herein or related art are introduced below briefly for clearer illustration of a technical solution herein. Note that the drawings described below refer merely to some embodiments herein. A person having ordinary skill in the art may acquire other drawings according to the drawings herein without creative effort.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In description as follows, for purpose of illustration rather than limiting, specifics such as a specific system structure, technology, etc., are proposed for a thorough understanding of embodiments herein. However, a skilled person in the art shall know that the subject disclosure may also be implemented in other embodiments without these specifics. In other cases, elaboration of a well-known system, apparatus, circuit, method, etc., is omitted, to prevent an unnecessary detail from obscuring description of the subject disclosure.

A technical solution herein is illustrated below with reference to specific embodiments.

Figure 1:
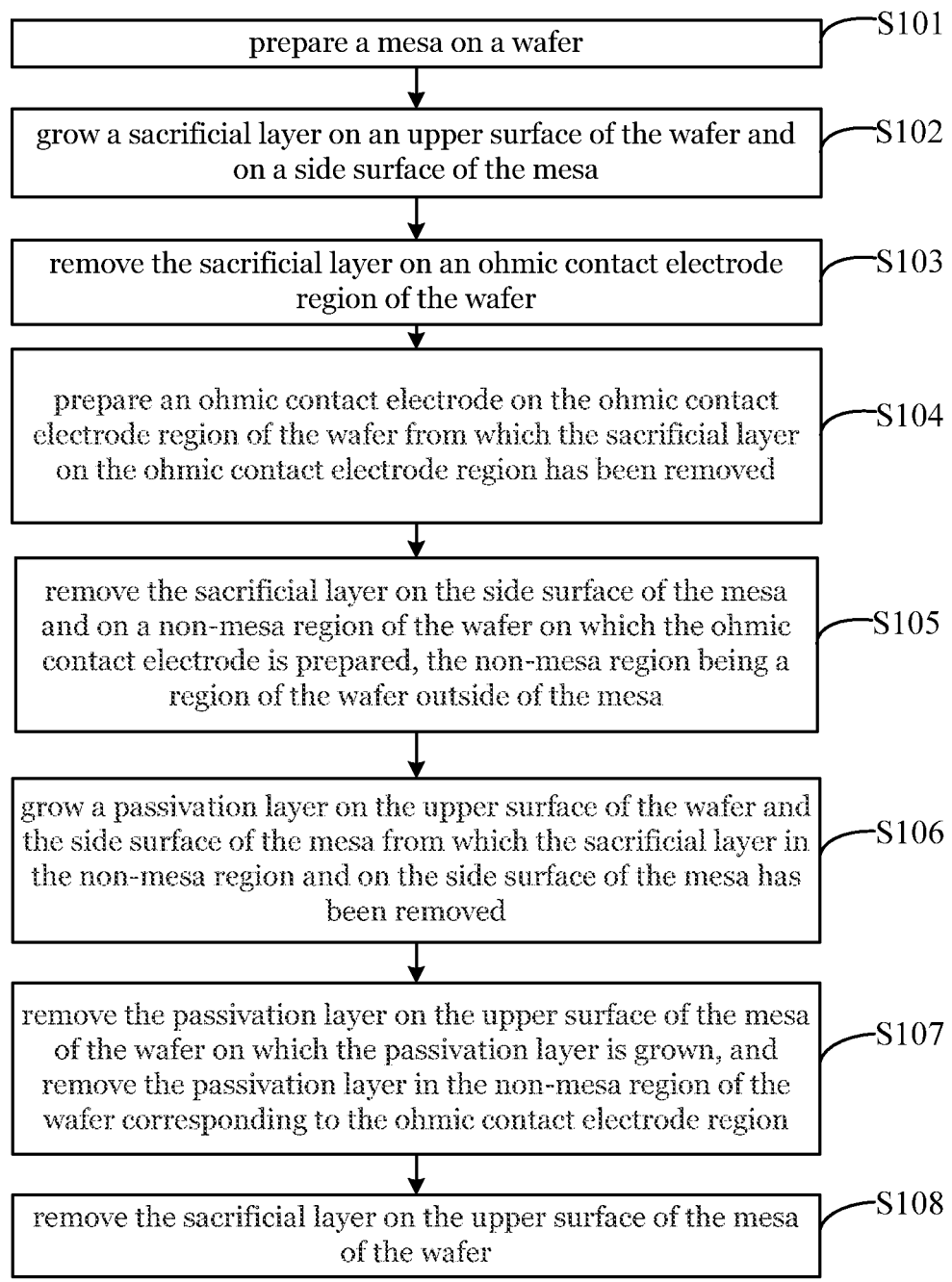
FIG. 1 is a flow chart of a method for preparing an avalanche photodiode according to an embodiment herein.

Referring to FIG. 1, a method for preparing an avalanche photodiode comprises options as follows.

At S101, prepare a mesa on a wafer.

In the embodiment of the disclosure, the wafer may be a silicon carbide wafer, a gallium nitride wafer or other wafer that can be used for preparing an avalanche photodiode. Preferably, the wafer is a silicon carbide wafer. Silicon carbide may be preferred for preparing an ultraviolet photo detector due to a property thereof such as a wide band gap, good thermal conductivity, a high saturation drift speed of electrons, a stable chemical property, and a low density of defects, etc. Concretely, the material of the wafer may be 4H—SiC.

In one embodiment, the wafer may comprise, from bottom to top, a substrate, a silicon carbide $P^+$ layer, a silicon carbide N layer, a silicon carbide $N^-$ layer, and a silicon carbide $N^+$ layer. Or the wafer may comprise, from bottom to top, a substrate, a silicon carbide $P^+$ layer, a silicon carbide $N^-$ layer, and a silicon carbide $N^+$ layer. Or the wafer may comprise, from bottom to top, a substrate, a silicon carbide $P^+$ layer, and a silicon carbide N layer.

In the embodiment of the disclosure, the silicon carbide $P^+$ layer may be a heavy-doped silicon carbide P-type layer. The silicon carbide $N^-$ layer may be a light-doped silicon carbide N-type layer. The silicon carbide $N^+$ layer may be a heavy-doped silicon carbide N-type layer. In one embodiment, the wafer may comprise, from bottom to top, a substrate, a silicon carbide $P^+$ layer, a silicon carbide N layer, a silicon carbide $N^-$ layer, and a silicon carbide $N^+$ layer. Therein, a doping concentration of the silicon carbide $P^+$ layer may be $1\times10^{18}$ $cm^{-3}$ to $1\times10^{20}$ $cm^{-3}$, and a doping concentration of the silicon carbide N layer may be $1\times10^{17}$ $cm^{-3}$ to $5\times10^{18}$ $cm^{-3}$, and a doping concentration of the silicon carbide $N^-$ layer may be $1\times10^{15}$ $cm^{-3}$ to $1\times10^{17}$ $cm^{-3}$, and a doping concentration of the silicon carbide $N^+$ layer may be $1\times10^{18}$ $cm^{-3}$ to $1\times10^{20}$ $cm^{-3}$. In other embodiment, the wafer may comprise, from bottom to top, a substrate, a silicon carbide $P^+$ layer, a silicon carbide $N^-$ layer, and a silicon carbide $N^+$ layer, forming a PIN structure. Therein, the doping concentration of the silicon carbide $P^+$ layer may be $1\times10^{18}$ $cm^{-3}$ to $1\times10^{20}$ $cm^{-3}$, and the doping concentration of the silicon carbide $N^-$ layer may be $1\times10^{15}$ $cm^{-3}$ to $1\times10^{17}$ $cm^{-3}$, and the doping concentration of the silicon carbide $N^+$ layer may be $1\times10^{18}$ $cm^{-3}$ to $1\times10^{20}$ $cm^{-3}$. In other embodiment, the wafer may comprise, from bottom to top, a substrate, a silicon carbide $P^+$ layer, and a silicon carbide N layer, forming a PN structure. Therein, the doping concentration of the silicon carbide $P^+$ layer may be $1\times10^{18}$ $cm^{-3}$ to $1\times10^{20}$ $cm^{-3}$, and the doping concentration of the silicon carbide N layer may be $5\times10^{17}$ $cm^{-3}$ to $1\times10^{20}$ $cm^{-3}$.

In one embodiment, S101 may be implemented as follows: etching the non-mesa region of the wafer via photolithography and an etching process, down to an upper surface of the silicon carbide $P^+$ layer.

Figure 2:
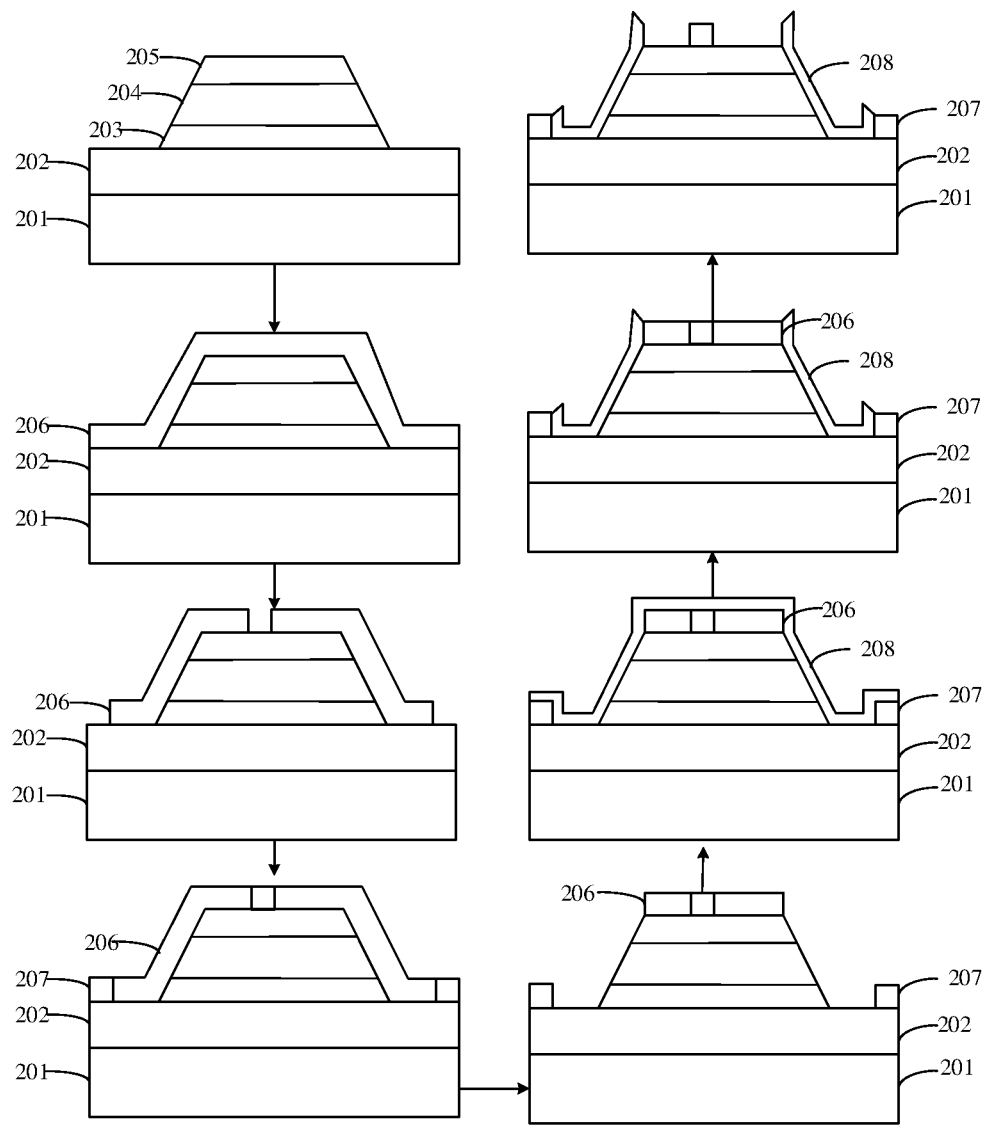
FIG. 2 is a sectional view of a structure of a method for preparing an avalanche photodiode according to an embodiment herein.

In the embodiment of the disclosure, the wafer may include a mesa region and a non-mesa area. The mesa region may be where the prepared mesa is located. The non-mesa region may be an area of the wafer outside the mesa region. As shown in FIG. 2, the mesa may be prepared on the wafer as follows. The mesa region of the wafer may be covered with a photoresist via photolithography. Then the silicon carbide N+ layer 205, the silicon carbide N− layer 204, and the silicon carbide N layer 203 of the wafer may be etched one by one via the etching process. At last, the photoresist may be removed, and the mesa may be prepared on the wafer.

In the embodiment of the disclosure, the mesa may be vertical, or tilted with a preset angle. Preferably, based on a mesa tilted with a preset angle, early breakdown of the device may be prevented effectively. To prepare a mesa tilted with a preset angle, the mesa region of the wafer may be covered with a photoresist layer tilted at a preset angle based on photolithography and a photoresist Reflow process. Then, etching may be performed via an etching process.

In one embodiment, the substrate may be a silicon carbide substrate.

In the embodiment of the disclosure, the substrate may be a silicon carbide substrate. A silicon carbide epitaxial layer may be grown on the silicon carbide substrate via homogeneous epitaxy. This may reduce a lattice mismatch and render a high-quality wafer.

At S102, grow a sacrificial layer on an upper surface of the wafer and on a side surface of the mesa.

In the embodiment of the disclosure, as shown in FIG. 2, a sacrificial layer 206 may be grown on the upper surface of the wafer and on the side surface of the mesa. The sacrificial layer 206 may be one of, or a multiple combination of, a silicon oxide layer, an aluminum oxide layer, a chromium oxide layer, an yttrium oxide layer, or a silicon nitride layer. A thickness of the sacrificial layer 206 may be 10 nm to 300 nm.

At S103, remove the sacrificial layer on an ohmic contact electrode region of the wafer.

In the embodiment of the disclosure, as shown in FIG. 2, the sacrificial layer 206 on the ohmic contact electrode region of the wafer may be removed. The ohmic contact electrode region may be an area where the ohmic contact electrode of the device is located. S103 may be implemented as follows. The area of the wafer outside the ohmic contact electrode region may be coated with a photoresist via photolithography. The sacrificial layer 206 on the ohmic contact electrode region may be removed via the etching process. The sacrificial layer on the area outside the ohmic contact electrode region may be protected by the photoresist from being removed.

At S104, prepare an ohmic contact electrode on the ohmic contact electrode region of the wafer from which the sacrificial layer on the ohmic contact electrode region has been removed.

In one embodiment, S104 may be implemented as follows: vapor-deposit a metal layer on the ohmic contact electrode region of the wafer from which the sacrificial layer on the ohmic contact electrode region has been removed. And prepare the ohmic contact electrode by annealing the wafer on which the metal layer is vapor-deposited in a nitrogen atmosphere.

In the embodiment of the disclosure, as shown in FIG. 2, the ohmic contact electrode 207 may be prepared on the ohmic contact electrode region of the wafer. The ohmic contact electrode may include an ohmic contact electrode on the non-mesa region and an ohmic contact electrode on the mesa region. The ohmic contact electrode on the non-mesa region may be a P-type electrode. The ohmic contact electrode on the mesa region may be an N-type electrode. The ohmic contact electrode on the non-mesa region may be a ring electrode surrounding the mesa. The ohmic contact electrode may be prepared as follows. The area of the wafer outside the ohmic contact electrode region may be coated with a photoresist via photolithography. A metal layer may be vapor-deposited onto the upper surface of the wafer via metal evaporation. The photoresist may be removed, then, the metal layer on the upper surface of the photoresist may be removed together. At last, the ohmic contact electrode may be formed by annealing the wafer in a nitrogen atmosphere.

At S105, remove the sacrificial layer in a non-mesa region of the wafer on which the ohmic contact electrode is prepared and on the side surface of the mesa, the non-mesa region being a region of the wafer outside of the mesa.

In the embodiment of the disclosure, as shown in FIG. 2, the sacrificial layer 206 on the non-mesa region of the wafer and the sacrificial layer 206 on the side surface of the mesa may be removed via the etching process. Only the sacrificial layer 206 on the upper surface of the mesa of the wafer may remain. The concrete implementation method is as follows. Firstly, the upper surface of the mesa of the wafer may be coated with a photoresist layer via photolithography. Then, the sacrificial layer 206 may be etched via the etching process.

At S106, grow a passivation layer on the upper surface of the wafer and the side surface of the mesa from which the sacrificial layer in the non-mesa region and on the side surface of the mesa has been removed.

In the embodiment of the disclosure, as shown in FIG. 2, a passivation layer 208 may be grown on the wafer. The passivation layer 208 may be one of, or a multiple combination of, a silicon oxide layer, an aluminum oxide layer, a chromium oxide layer, an yttrium oxide layer, or a silicon nitride layer. A thickness of the passivation layer 208 may be 50 nm to 500 nm.

At S107, remove the passivation layer on the upper surface of the mesa of the wafer on which the passivation layer is grown, and remove the passivation layer in the non-mesa region of the wafer corresponding to the ohmic contact electrode region.

In the embodiment of the disclosure, as shown in FIG. 2, the passivation layer on the upper surface of the mesa and the passivation layer on the non-mesa region corresponding to the ohmic contact electrode region may be removed via photolithography and etching. The passivation layer may be formed on the side surface of the mesa of the wafer and on the area of the non-mesa region outside the ohmic contact electrode region.

At S108, remove the sacrificial layer on the upper surface of the mesa of the wafer.

In the embodiment of the disclosure, as shown in FIG. 2, the sacrificial layer 206 on the upper surface of the mesa of the wafer may be removed via photolithography and etching to form an optical window on the wafer, so as to prepare an avalanche photodiode with an optical window.

With embodiments herein, an avalanche photodiode with an optical window is prepared by: preparing a mesa on a wafer; growing a sacrificial layer on an upper surface of the wafer with the mesa prepared, and on a side surface of the mesa; removing the sacrificial layer on an ohmic contact electrode region of the wafer; preparing an ohmic contact electrode on the ohmic contact electrode region of the wafer from which the sacrificial layer on the ohmic contact electrode region has been removed; removing the sacrificial layer in a non-mesa region of the wafer on which the ohmic contact electrode is prepared and on the side surface of the mesa; growing a passivation layer on the upper surface of the wafer and the side surface of the mesa from which the sacrificial layer in the non-mesa region and on the side surface of the mesa has been removed; removing the passivation layer on the upper surface of the mesa of the wafer on which the passivation layer is grown, and removing the passivation layer in the non-mesa region of the wafer corresponding to the ohmic contact electrode region; and removing the sacrificial layer on the upper surface of the mesa of the wafer. With embodiments herein, in preparing the optical window, by growing a sacrificial layer on the upper surface of a wafer and removing the sacrificial layer in two steps, a photosensitive surface of a device is protected from damages, thereby decreasing a leakage current of the device, and improving responsivity and quantum efficiency of the device.

Note that a magnitude of a sequence number of a step or process in embodiments herein does not indicate an order in which the step is executed. The steps or processes are to be executed in an order determined by functions and intrinsic logics thereof. Such a sequence number shall constitute no limit to implementation of the embodiments herein.

The embodiments are merely for explaining a technical solution herein, and are not intended to limit the subject disclosure. The subject disclosure is elaborated with the embodiments. A person having ordinary skill in the art may modify a technical solution according to the embodiments, or perform an equivalent replacement to a feature thereof without essentially departing from the spirit and scope of the technical solution according to the embodiments. Any such modification and/or equivalent replacement should be covered by the scope of the claims herein.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method for preparing an avalanche photodiode, comprising:
    preparing a mesa on a wafer;
    growing a sacrificial layer on an upper surface of the wafer and on a side surface of the mesa;
    removing the sacrificial layer on an ohmic contact electrode region of the wafer;
    preparing an ohmic contact electrode on the ohmic contact electrode region of the wafer from which the sacrificial layer on the ohmic contact electrode region has been removed;
    removing the sacrificial layer on the side surface of the mesa and on a non-mesa region of the wafer on which the ohmic contact electrode is prepared, the non-mesa region being a region of the wafer outside of the mesa;
    growing a passivation layer on the upper surface of the wafer and the side surface of the mesa from which the sacrificial layer in the non-mesa region and on the side surface of the mesa has been removed;
    removing the passivation layer on the upper surface of the mesa of the wafer on which the passivation layer is grown, and removing the passivation layer in the non-mesa region of the wafer corresponding to the ohmic contact electrode region; and
    removing the sacrificial layer on the upper surface of the mesa of the wafer, and wherein the step of preparing the ohmic contact electrode on the ohmic contact electrode region of the wafer from which the sacrificial layer on the ohmic contact electrode region has been removed comprises:
        vapor-depositing a metal layer on the ohmic contact electrode region of the wafer from which the sacrificial layer on the ohmic contact electrode region has been removed; and
        preparing the ohmic contact electrode by annealing the wafer on which the metal layer is vapor-deposited in a nitrogen atmosphere.

2. The method of claim 1, wherein the wafer comprises, from bottom to top, a substrate, a silicon carbide $P^+$ layer, a silicon carbide N layer, a silicon carbide $N^-$ layer, and a silicon carbide $N^+$ layer; or
    wherein the wafer comprises, from bottom to top, a substrate, a silicon carbide $P^+$ layer, a silicon carbide $N^-$ layer, and a silicon carbide $N^+$ layer; or
    wherein the wafer comprises, from bottom to top, a substrate, a silicon carbide $P^+$ layer, and a silicon carbide N layer.

3. The method of claim 2, wherein the step of preparing the mesa on the wafer comprises:
    etching the non-mesa region of the wafer via photolithography and etching process, down to an upper surface of the silicon carbide $P^+$ layer.

4. The method of claim 2, wherein the substrate is a silicon carbide substrate.

5. The method of claim 1, wherein the mesa is tilted with a preset angle.

6. The method of claim 1, wherein the sacrificial layer is one of, or a multiple combination of, a silicon oxide layer, an aluminum oxide layer, a chromium oxide layer, an yttrium oxide layer, or a silicon nitride layer.

7. The method of claim 1, wherein the passivation layer is one of, or a multiple combination of, a silicon oxide layer, an aluminum oxide layer, a chromium oxide layer, an yttrium oxide layer, or a silicon nitride layer.

8. The method of claim 1, wherein a thickness of the sacrificial layer is from 10 nm to 300 nm, and wherein a thickness of the passivation layer is from 50 nm to 500 nm.

9. The method of claim 1, wherein a material of the ohmic contact electrode is one of, or a multiple combination of, nickel, titanium, aluminum, or gold.

* * * * *